United States Patent
Spotti et al.

(10) Patent No.: US 9,711,676 B2
(45) Date of Patent: Jul. 18, 2017

(54) AUTOMATIC PRODUCTION SYSTEM AND PRODUCTION PROCESS OF A CONDUCTIVE BACKSHEET WITH INTEGRATED ENCAPSULATING AND DIELECTRIC LAYER FOR PHOTOVOLTAIC PANELS

(71) Applicant: VISMUNDA SRL, Venice (IT)

(72) Inventors: Davide Spotti, Trieste (IT); Elisa Baccini, Carbonera (IT)

(73) Assignee: VISMUNDA SRL, Venice (IT)

( * ) Notice: Subject to any disclaimer, the term of this patent is extended or adjusted under 35 U.S.C. 154(b) by 0 days.

(21) Appl. No.: 15/035,425

(22) PCT Filed: Nov. 18, 2014

(86) PCT No.: PCT/IB2014/002491
§ 371 (c)(1),
(2) Date: May 9, 2016

(87) PCT Pub. No.: WO2015/075529
PCT Pub. Date: May 28, 2015

(65) Prior Publication Data
US 2016/0293791 A1    Oct. 6, 2016

(30) Foreign Application Priority Data
Nov. 21, 2013    (IT) .............................. TV2013A0192

(51) Int. Cl.
*H01L 31/18*    (2006.01)
*H01L 31/05*    (2014.01)
(Continued)

(52) U.S. Cl.
CPC .......... *H01L 31/188* (2013.01); *H01L 31/049* (2014.12); *H01L 31/0516* (2013.01); *H02S 40/34* (2014.12); *Y02E 10/50* (2013.01)

(58) Field of Classification Search
CPC . H01L 31/048; H01L 31/02013; H01L 31/18; H01L 31/188
See application file for complete search history.

(56) References Cited

U.S. PATENT DOCUMENTS

| 2010/0242243 A1* | 9/2010 | Kroskey ................. B32B 37/20 29/56.5 |
| 2012/0240995 A1* | 9/2012 | Coakley .............. H01L 31/0201 136/256 |
| 2013/0112233 A1 | 5/2013 | Coakley |

FOREIGN PATENT DOCUMENTS

WO    2013085387 A2    6/2013

OTHER PUBLICATIONS

International Search Report for corresponding International Application No. PCT/IB2014/002491.

* cited by examiner

*Primary Examiner* — Jaehwan Oh
(74) *Attorney, Agent, or Firm* — Egbert Law Offices, PLLC

(57) ABSTRACT

Automatic production system and production process for the automatic manufacturing of conductive backsheets with an integrated encapsulating and dielectric layer, for photovoltaic panels of the back-contact type. The system includes operating stations in sequence and is made up of at least one main line combined with a secondary line having a flow converging to a station of calibrated superimposition with fixing. The main line, on trays on a continuous conveying system, arranges and prepares the back supporting and conductive layer, whereas the secondary line forms the encapsulating and dielectric multi-layer element holed in correspondence of the electrical contacts comprising an automatic picking device which takes, roto-translates and holds said multi-layer element during processing and (Continued)

releases it only after the calibrated superimposition with fixing. The system is combined with a control system made up of at least four devices integrated with one another to enable calibration and check the automated processes.

10 Claims, 6 Drawing Sheets

(51) Int. Cl.
 *H01L 31/049* (2014.01)
 *H02S 40/34* (2014.01)

AUTOMATIC PRODUCTION SYSTEM AND PRODUCTION PROCESS OF A CONDUCTIVE BACKSHEET WITH INTEGRATED ENCAPSULATING AND DIELECTRIC LAYER FOR PHOTOVOLTAIC PANELS

The present invention relates to an automatic production system and production process of a conductive backsheet with an integrated encapsulating and dielectric layer, for photovoltaic panels made with back-contact cells of crystalline silicon.

FIELD OF THE INVENTION

The invention finds particular application in the industrial sector of production of photovoltaic panels, with specific reference to the modern photovoltaic panels with back-contact cells; such panels have at the back a multi-layer component which integrates the electrical contacts and is conventionally called backsheet of the conductive type. The present invention allows to produce in an advantageous way a particular type of conductive backsheet with an integrated encapsulating and dielectric layer.

Nowadays, in principle, it is possible to consider as widely known the advantages provided by the known solutions of photovoltaic panels having cells of the back-contact type; however, due to many realization difficulties which are mainly linked to the low availability of systems and of processes suitable for the current production standards, in particular with reference to the required processing precision, to product quality, to the automation of the systems and to industrial costs, most of the panels which today are present on the market have conventional construction architectures, of the non-back-contact type, very similar to each other in their concept, basic components and assembly process. For the purpose of introducing the technical and functional aspects on which the proposed solution is based, in the following we will recall the main conventional solutions of panels, the production systems and processes being closely connected to the configuration of the product and to the complexity of its assembly.

For example, we would like to remind the architecture of the non-back-contact, called H-type, also called of first generation, whose basic components starting from the back side not exposed to the sun substantially are: a backsheet of protection from the weather which is placed on the back side of the panel, also being referred to by the acronym BS; the photovoltaic cells, of single-crystal or multi-crystal silicon, having the electrical contacts of opposite polarity placed respectively on the front and on the back; the strings intended to weld in series two by two the front and the back of the adjacent cells; the conductive tapes, also called ribbons in the English language, which connect in series said strings by interposing diodes in the junction box; two layers of encapsulating material, generally ethyl vinyl acetate (EVA), intended to enclose at the front and at the back said cells, said strings and said ribbons; a flat glass which encloses and protects the front side of the panel, exposed to the sun; a frame which encloses the perimeter of the panel; said junction box being placed on the back side of the BS for the purpose of collecting the contacts from the back connecting to said ribbons. It is widely known that the assembly process of these panels is slow and laborious as it is carried out, excluding the phase of welding of the strings to the cells, mostly manually.

Still as an example, we recall an evolved solution of photovoltaic panel with an architecture of the back-contact type, also called of second generation, whose basic components are described in detail in the following starting from the back side towards the front side exposed to the sun:

a backsheet of the back-contact type, also called conductive backsheet or BC, which comprises an internal conductive metal layer for the electrical connection of the cells of the back-contact type, said layer being generally made by rolling with following selective removal in such a way as to realize a circuit which will connect electrically in series the solar cells placed thereon. Today such a configuration is widely known because various solutions are available, such as milling, etching, cutting, lasering, selective deposition on said BS or other equivalent solutions;

a plurality of photovoltaic cells of the back-contact type, of single-crystal or multi-crystal silicon, having the contacts with both positive and negative electrical polarity placed at the back; for example, one should remember the known cell structures which are called Metal Wrap Through, also known by the acronym MWT, or even the cells called Emitter Wrap Through, also known by the acronym EWT, or still the cells called Interdigitated Back Contact, also known by the acronym IBC. In patent literature various solutions of cells of the back-contact type are known, such as the solutions as in US2004261840 (Schmit et al.) or in EP2212915 (Mihailetchi);

a conductive material between said BC and the back faces of the cells, in correspondence of the contacts of different electrical polarity of the cells themselves, being for example of the type called Electronic Conductive Adhesive or ECA, or of the welding paste type or other equivalent materials; said material being generally applied by silkscreen printing or with a dispensing unit, with a system of the ink-jetting type or with other equivalent laying solutions;

two layers of encapsulating material, generally ethyl vinyl acetate (EVA), the back layer of which is holed in correspondence of the contacts created by said conductive material, enclosing at the front and at the back all the elements described above;

an insulating material which is generally superimposed by silkscreen printing on said BC having openings in correspondence of the zones of contact with the back polarities of said cells;

a flat glass, a frame and a junction box as described above.

The production process of such a panel in particular allows to reduce manual working, increasing the degree of industrialization and repeatability; for the sake of simplicity and in order to better understand the advantages of the invention, please refer to the description of the process at the respective simplified flowchart, see prior art table (FIG. 1a).

PRIOR ART

For the purpose of determining the prior art related to the proposed solution a conventional check was made, searching public archives, which has led to find some prior art documents, among which:

D1: WO2012015307 (De Jong et al.)
D2: EP2139050 (Bakker et al.)
D3: ITTV2012A000211 (Baccini et al.)
D4: WO2012058053 (Meakin et al.)

D1 proposes a module with back-contact solar cells where electrical conduction is entrusted to a planar element made up of three layers, with the two external conductive layers which are separate by an interposed insulating layer being configured in such a way as to contact in sequence adjacent pairs of cells; the manufacturing process of such a module initially provides to place the cells on a planar surface, the laying of said multi-layer contacting element in such a way as to connect in series a first pair of adjacent cells on the first conductive layer and therefore the series connection to a second pair of cells on the second conductive layer, and so on in sequence to complete the connections, afterwards one provides two further external layers in the form of encapsulating material of the whole package so made which is then supported by a back rigid layer and a front transparent glass.

D2 proposes an assembly process for panels of the back-contact type starting from a conductive backsheet of the conventional type placed with the conductive layer upwards on which the conductive adhesive material is placed and then the lower encapsulating layer is superimposed which is holed, matching the holes with said conductive material; then one lays the cells, the upper encapsulating layer and the glass to be then subjected to the final rolling, see prior art table (FIG. 1a).

D3 describes a fully automatic assembly process starting from a particular conductive backsheet with an integrated encapsulating and dielectric layer, conventionally called BCBS and made separately to be considered like a purchase component, which allows to realize an innovative and advantageous photovoltaic panel structure of the back-contact type with greater production quality and lower industrial costs, see prior art tables (FIGS. 1b, 2a-b). Said BCBS is made up of a double layer of encapsulating material with interposed dielectric, holed and placed with precision on the conductive sheet to be joined to the supporting backsheet; on said BCBS placed horizontally on a tray with the conductive layer upwards and with the contacting areas of the cells already masked it is therefore possible to lay directly and automatically a conductive material like ECA, with distribution of the type called drop by drop or dispensing, providing an electronic control system for the recognition of position; afterwards one lays the cells, the upper encapsulating layer and the glass, to be then subjected to the final rolling.

D4 proposes the following process for panels of the back-contact type: laying of conductive ribbons on a backsheet on which some adhesive material has been previously applied, such as EVA; laying of dielectric material on the conductive ribbons; laying of conductive material, such as ECA, on the conductive ribbons however without specifying with which positioning logic; laying of cells, upper EVA layer, glass and final rolling. As an alternative one lays the conductive ribbons on a backsheet on which some adhesive material has been previously applied, for example EVA; laying of dielectric material on the conductive ribbons; laying of conductive material, such as ECA, on the conductive ribbons without specifying with which positioning criterion; laying of a holed EVA layer with the holes in correspondence of where the ECA was laid; laying of cells, upper EVA layer, glass and final rolling.

In conclusion it is reasonable to consider as known:
a photovoltaic panel of first generation with cells of the conventional type and with a structure with superimposed layers, being assembled in a mainly manual way;
a photovoltaic panel of second generation with cells of the back-contact type and a supporting backsheet comprising the electrical circuits, on which one then lays in sequence: the layer of dielectric material as an insulating mask, the conductive material, the lower encapsulating layer with centring of the holes on the contacts, the cells, the upper encapsulating layer, the glass;
systems and processes intended to assemble said panels of first and second generation;
a particular and advantageous solution of a panel of second generation which comprises a conductive backsheet of the evolved type called BCBS, which integrates the functions of dielectric mask and of lower encapsulating layer;
a system and a process for the automatic assembly of a panel of second generation starting from a conductive backsheet of the BCBS type already made.

DRAWBACKS

In conclusion, we have observed that the known solutions described have some drawbacks or anyway some limits.

Firstly, in the panels of first generation it has been found that the welding process of the cell strings implies great variability of the result in terms of breaking, contact resistances, cell deterioration, long-time duration and against thermal cycle tests, therefore obtaining a high cell-to-module loss, which typically reaches absolute values between 2.5% and 6% of the overall conversion efficiency; moreover, it has been found that the welding process has a high circuit layout complexity of the series connection between the cells by means of strings and ribbons which are normally rectilinear; furthermore, it has been found that there are large thicknesses of the encapsulating layers for the purpose of housing the summed up thicknesses of photovoltaic cells plus the front and back strings. In principle, it is therefore preferable to produce panels with cells of the back-contact type with respect to said panels of first generation.

Secondly, it has been found that generally the surface on which the cells are laid is not perfectly planar, with high risks and with the probability of breaking during the assembly process and during the operation of the panel, which heating up by effect of the sun and of the current generated in the metal conductors applies mechanical stress to the cells themselves; today this problem is a known limit to the thickness of the photovoltaic cells which could instead be thinner and less expensive, with equal generated energy.

Thirdly, it has been found that today assembly processes are little automated and include several manual operations, with high probability of errors, reprocessing and waste and as a consequence with a decrease in the quality and reliability and with high industrial and labour costs; this problem is mainly linked to the complex and expensive automation of the systems and of the processes which are arranged according to a specific panel configuration. Furthermore, we found a limit in quality control and in the conventional methods of product inspection during the assembly process, in particular in the case of high production volumes; this control is generally entrusted to the experience of the operators who carry out visual checks or accurate electronic controls are used, since integrated control solutions intended to check in an automatic and repeatable way the various production phases are not known.

Fourthly, in the known assembly processes of the panels of the back-contact type, as for example in D2, a particular difficulty was found in the correct positioning of the holed lower encapsulating layer, which is interposed between the BC and the cells, being of the flexible and deformable type and of difficult positioning on said BC, a high degree of accuracy being necessary when the conductive material has been previously applied on the BC in such a way as to match each hole of said encapsulating layer. In fact, it is known that this operation implies a high probability of deformation of said holed encapsulating layer as well as of offsetting of the holes with respect to said BC, being particularly weakened by the holes because of the nature and of the reduced thickness of the material; as a result, a high risk of contamination by the conductive material which makes the contacts is observed, there also being the possibility of a dangerous short-circuit towards the subsequently superimposed cells. Furthermore, we remind that said conductive material is previously laid and is therefore subject to flashes or offsetting due to the following application of the lower encapsulating layer.

Still it has been found that in the known assembly processes of the panels of the back-contact type as for example in D3, see prior art tables (FIGS. 1b, 2a-b), and with particular reference to the advantageous solution of a conductive backsheet with an integrated encapsulating and dielectric layer, also referred to by the acronym BCBS, automatic systems and processes optimized for its manufacturing are not known. More in general, on the market there is no BC at competitive prices and there is no system which enables, in a convenient and advantageous way in terms of working times and costs, to industrially assemble conductive backsheets with high quality standards and high production volumes.

Furthermore, it was also observed that the established practice in the known art to apply by silkscreen printing the insulating dielectric mask directly on the metal conductive layer of the BC is a limit in the adoption of the conductive backsheet for the construction of the panels. This practice, in fact, implies long working times and a high degree of complexity since at least three operating phases are required, that is to say, silkscreen printing, hardening or curing and washing, with low tolerances of the process parameters; to this purpose, moreover, one generally uses dielectric materials which are typically used in the electronics sector which, besides being very expensive, are little durable outside, that is to say, in the normal operating conditions of a photovoltaic panel.

Still with reference to the known assembly processes of the panels of the back-contact type, as for example in D1, D2 and D4, it was particularly observed that a high amount of operations and passages is required for the purpose of obtaining a BC comprising the dielectric mask, encapsulating layer and conductive material, since a high degree of accuracy, of repeatability, of control and of reliability is required.

Hence the need for the companies of the sector to find solutions which are more effective with respect to the existing solutions; the aim of the present invention is also to solve the described drawbacks.

SHORT DESCRIPTION OF THE INVENTION

This and other aims are achieved by the present invention according to the characteristics as in the appended claims, solving the arising problems by means of an automatic production system and process for the automatic manufacturing of conductive backsheets with an integrated encapsulating and dielectric layer, for photovoltaic panels of the back-contact type. The system includes operating stations in sequence and consists of at least one main line combined with a secondary line having a flow converging to a station of calibrated superimposition with fixing. The main line, on trays on a continuous conveying system, arranges and prepares the supporting and conductive back layer, while the secondary line forms the encapsulating and dielectric multi-layer element which is holed in correspondence of the electrical contacts comprising an automatic picking device which takes, roto-translates and holds said multi-layer element during processing and releases it only after said calibrated superimposition with fixing. The system is associated with a particular control system made up of at least four devices integrated with one another to enable calibration and check the automated processes.

AIMS

In this way by the considerable creative contribution the effect of which has allowed to reach a considerable technical progress, some aims and advantages are achieved solving the main problems mentioned above.

A first aim of the invention was to produce in an industrially advantageous way a conductive backsheet with an integrated encapsulating and dielectric layer of the BCBS type, as described above, by means of an innovative automatic production system and related production process. In particular, said system and said process obtain conductive backsheets of the BCBS type with low costs, high performances, excellent quality and long life; said system and said process, moreover, allow for high production capacity in a reduced occupation surface, being industrially advantageous.

A second aim was to eliminate the problems linked to manual operations, also introducing an integrated control system; for example, it is possible to obtain the automatic and precise positioning of the sheets and it is also possible to arrange the backsheet by automatically inserting some conductive elements intended to facilitate the electrical connection to the junction box, which is fixed on the back of the photovoltaic panel after the rolling phase. In particular, the present invention allows to advantageously realize known solutions and also innovative solutions of contacting within the production cycle, with precision and without handling, at extremely low costs; for example, it is possible to insert in an automatic way conductive elements of the through type or to integrate on the surface innovative contacting systems, also of the non-through type, being inserted into recessed seats and made simultaneously to through-openings.

A third aim was to provide high production flexibility, allowing for rapid changes in the configuration of the holes to be made on the encapsulating and dielectric multi-layer for the purpose of the following superimposition to the conductive backsheet, being provided according to the actual arrangement of the cells to be contacted at the back; said variability allows, for example, to realize easily and with precision minimum production batches, also tending to one piece only with no productivity loss of the system.

A fourth aim was to allow the elimination of the conventional silkscreen printing which forms an insulating layer on the conductive backsheet, with a significant saving in terms of time and costs. Moreover, it was possible to replace the conventional insulating solutions which today are used in the backsheets of the back-contact type with a more modern and cheaper solution, as described above, with a constant and stable structure and with the combined insulating and encapsulating functions which is more resistant in time; furthermore, the insulator inserted with a high productivity process, called roll-to-roll, into the encapsulating material below the cells enables a significant cost reduction with respect to the dielectric mask laid on the conductive layer. As an alternative and replacement of said multi-layer Stack one can also adopt a solution with one single layer which combines the adhesive and encapsulating behaviour with the dielectric insulating function, thanks to a suitably charged film polymer: for the purposes of the present invention the fact that said Stack in the BCBS is a multi-layer component or a multifunction single layer does not change anything in terms of the proposed aims, advantages and solution.

A further aim was to allow the automatic realization of said conductive backsheet of the BCBS type in such a way as to improve repeatability and increase the quality standards of the finished product, with respect to the conventional solutions; in particular, one provides a continuous automatic quality control during the processing phases in such a way that, in case of incorrect operations, the addition of other components and/or operations is immediately prevented for the purpose of reducing as a whole the waste of time and materials, the value of any discarded material and the cost for any reprocessing.

These and other advantages will appear from the following detailed description of some preferred embodiments, with the aid of the schematic drawings enclosed whose details of execution are not to be considered limitative but only illustrative.

CONTENT OF THE DRAWINGS

FIG. 1a schematically shows an assembly process of photovoltaic panels with a back-contact architecture starting from a conductive backsheet of the conventional type, according to the known art as for example in D2.

FIG. 1b schematically shows an assembly process of photovoltaic panels with a back-contact architecture starting from a particular conductive backsheet with an integrated encapsulating and dielectric layer, of the type called BCBS, according to the known art as for example in D3.

Figure 3:
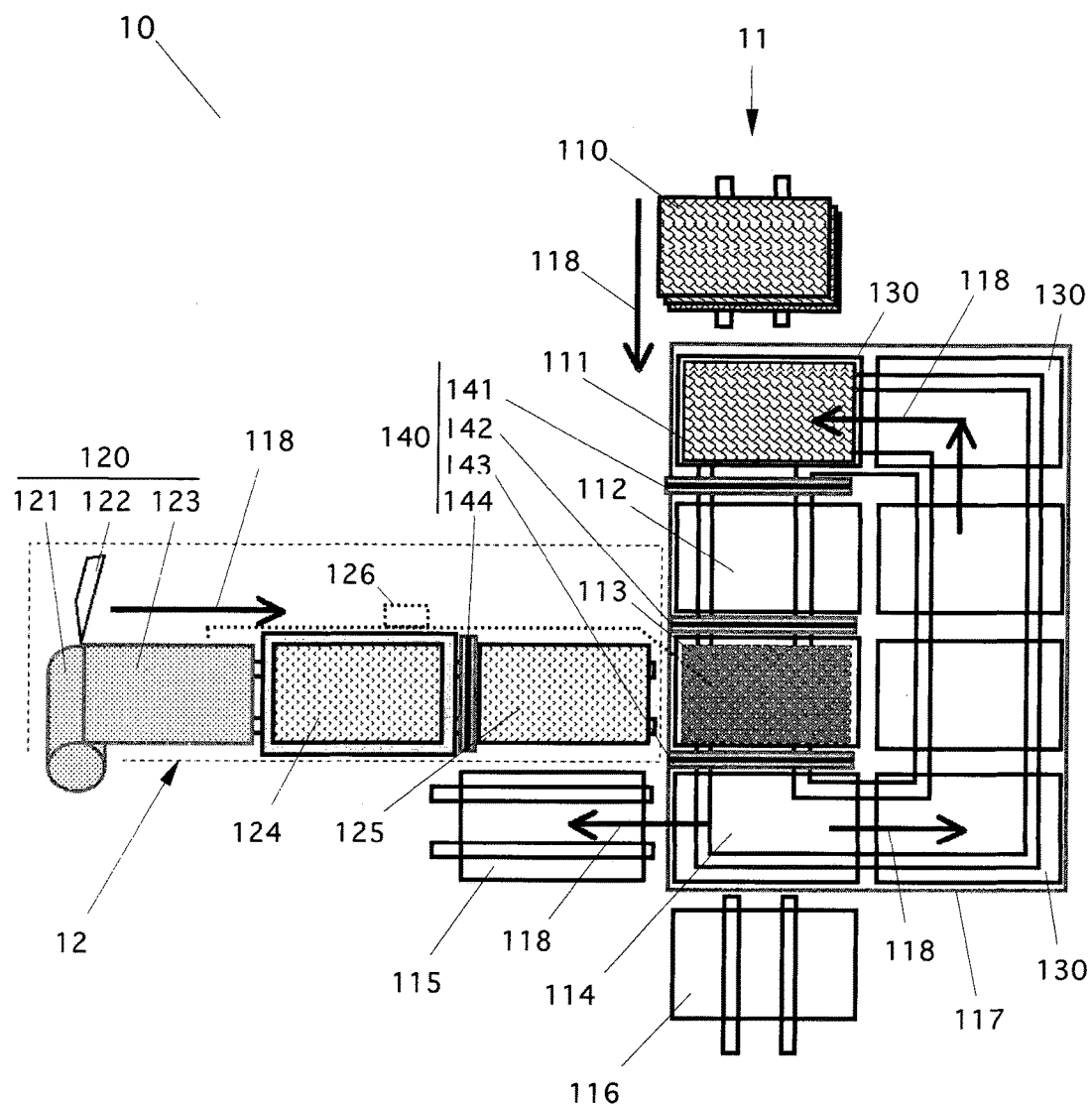
FIG. 3 shows, in a schematic view from above, the automatic production system object of the present invention.
Figure 4A:
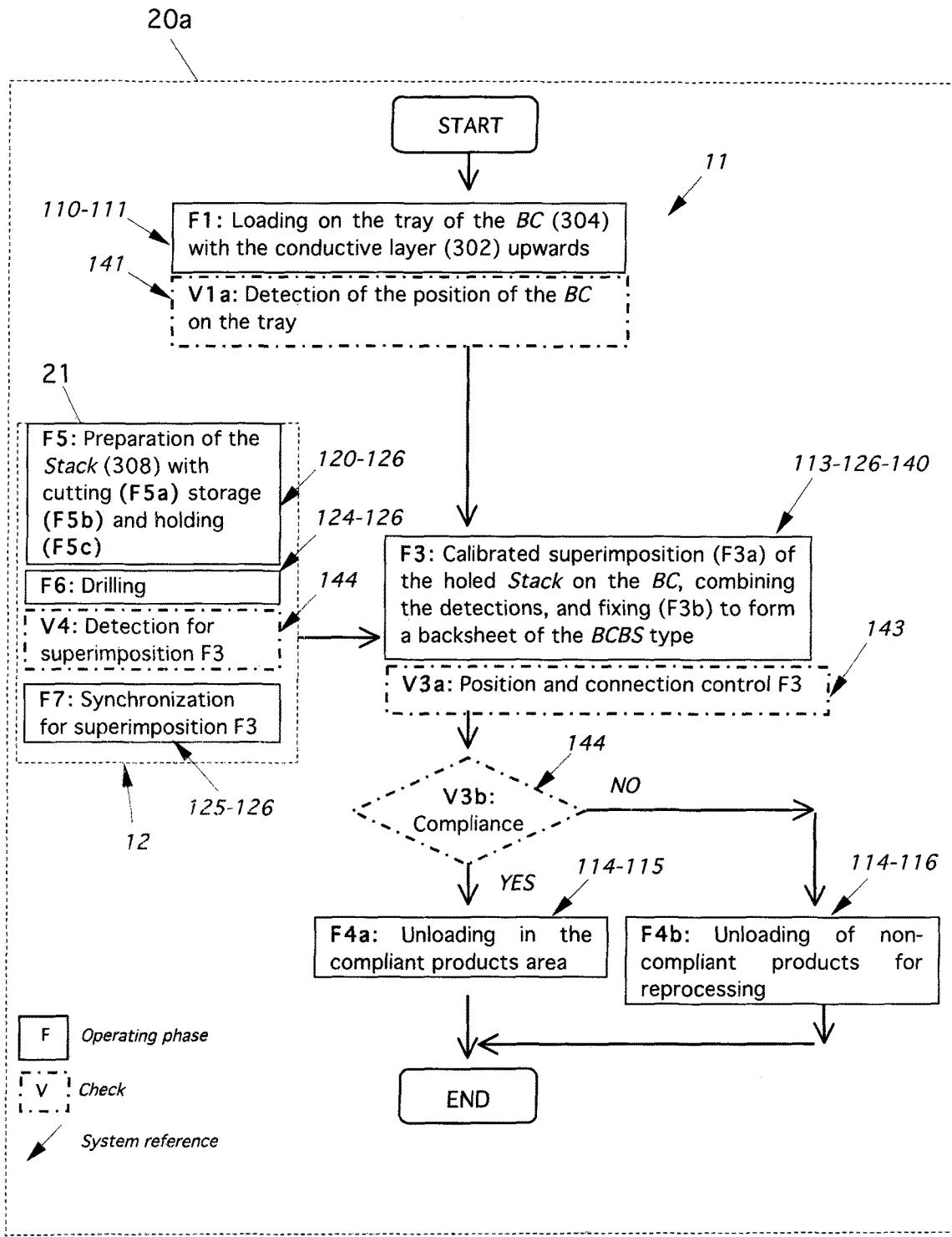
Figure 4B:
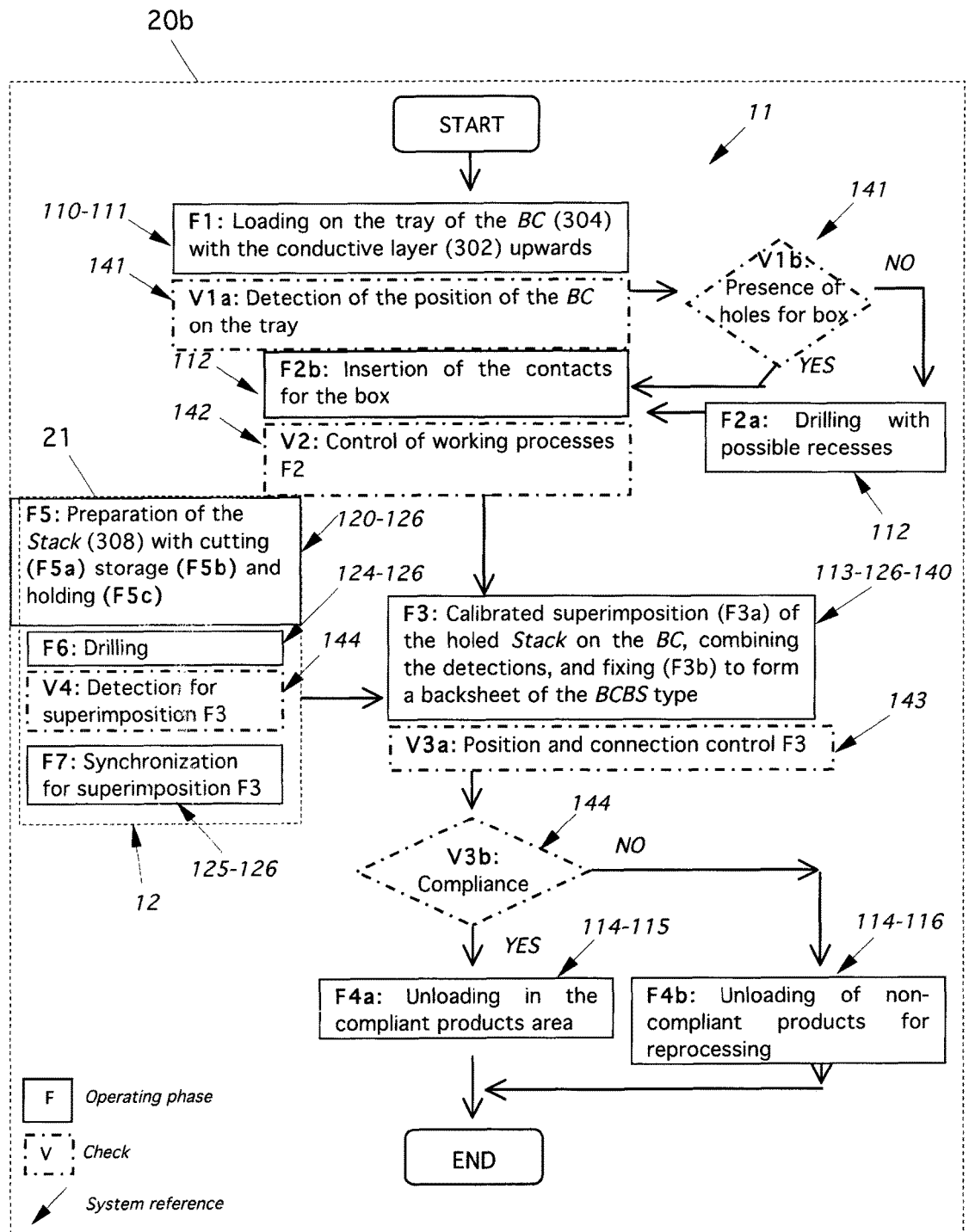

FIGS. 4a-b show, in a simplified flowchart, the production process object of the present invention, also with the references to the system as in FIG. 3, being respectively referred to a solution which does not provide the arrangement of the contacting for the junction box (FIG. 4a) and to a solution which provides this arrangement (FIG. 4b).

DESCRIPTION OF AT LEAST ONE EMBODIMENT OF THE INVENTION

Figure 1A:
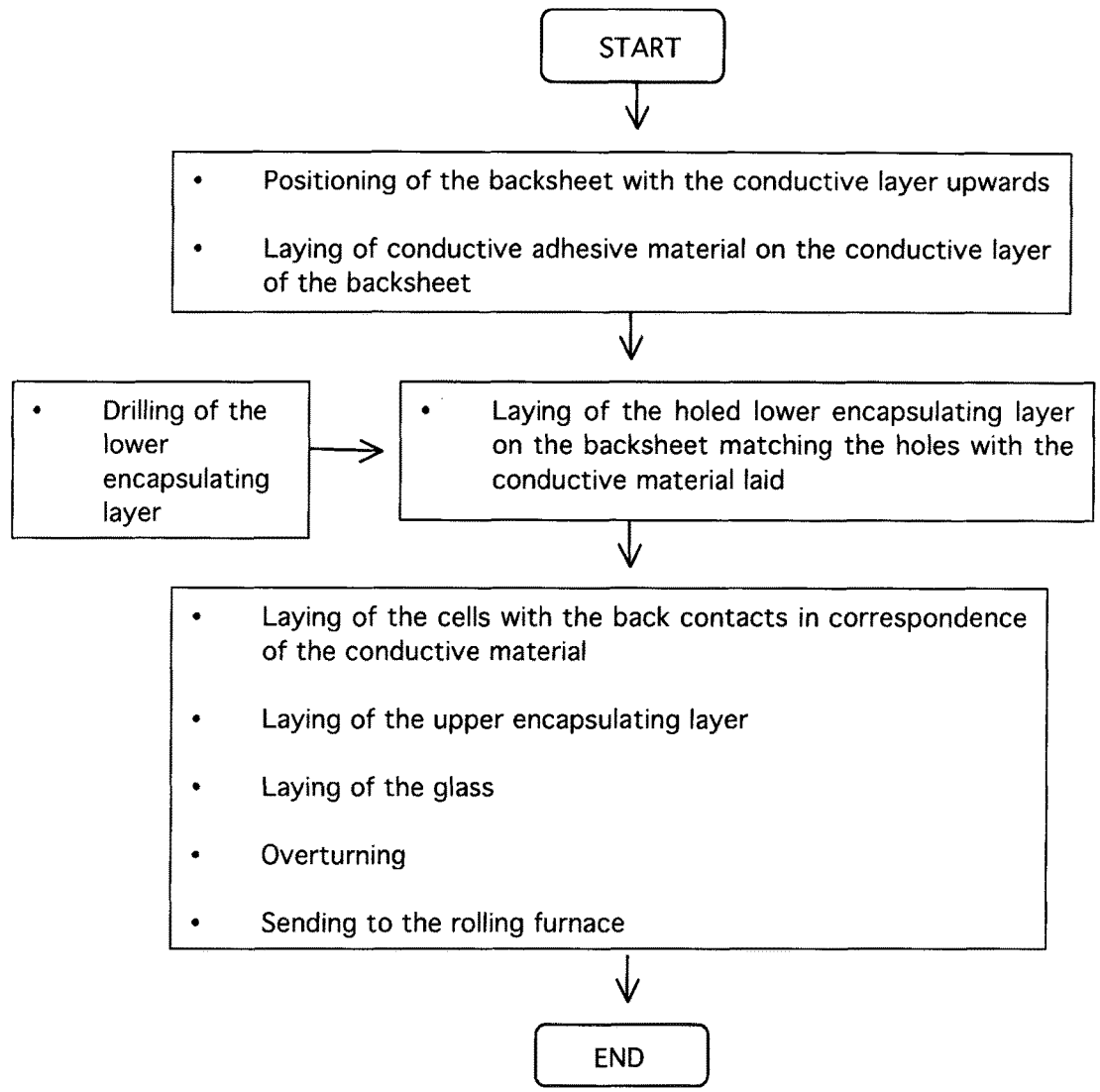
Figure 1B:
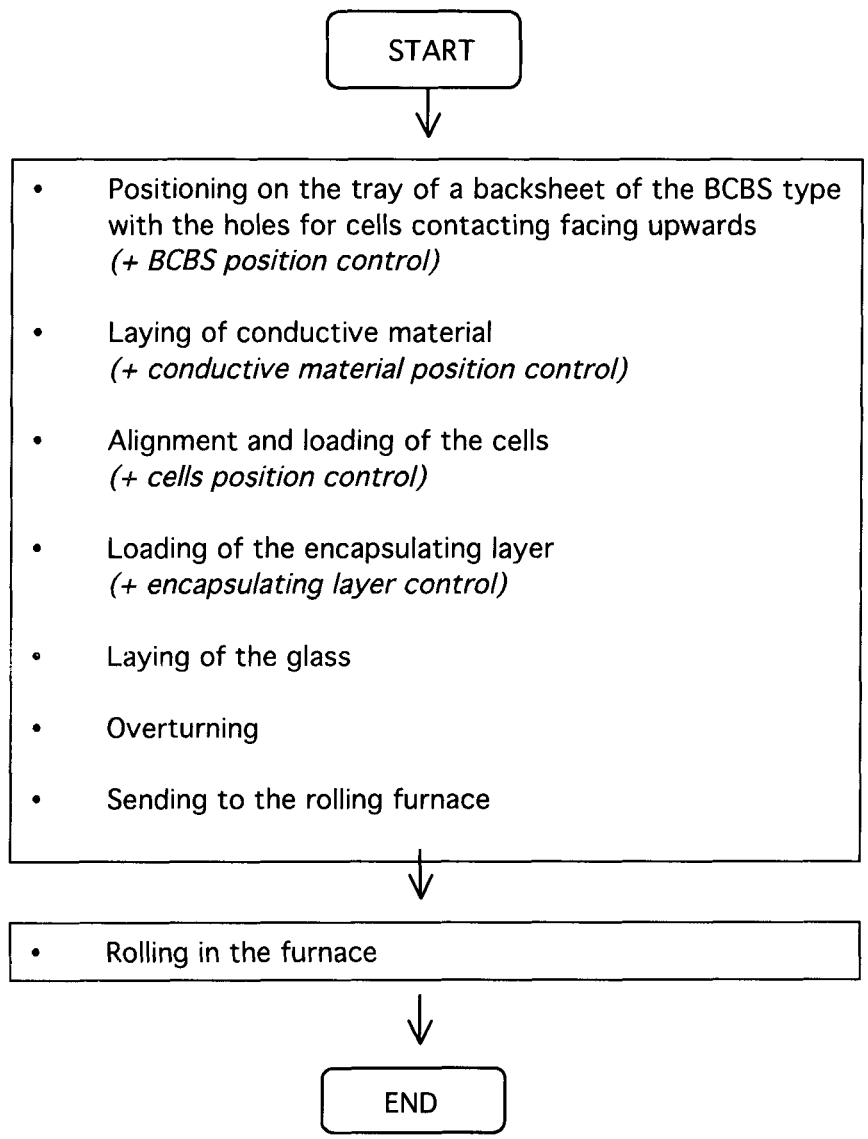
Figure 2A:
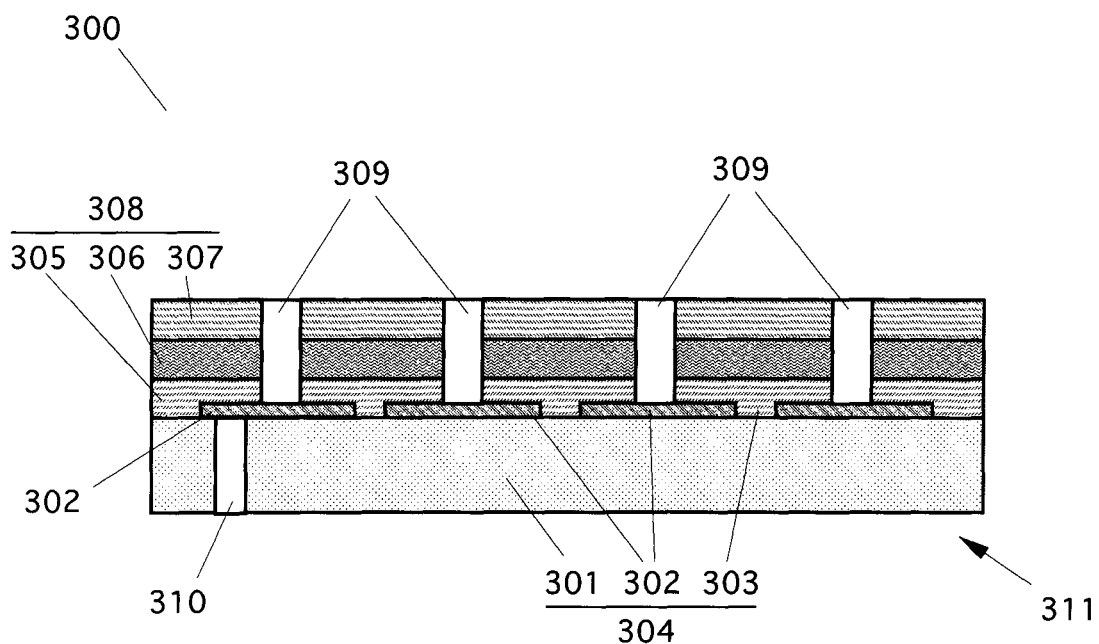
FIG. 2a shows, in a schematic sectional view, a conductive backsheet with an integrated encapsulating and dielectric layer, of the type called BCBS, according to the known art as for example in D3.
Figure 2B:
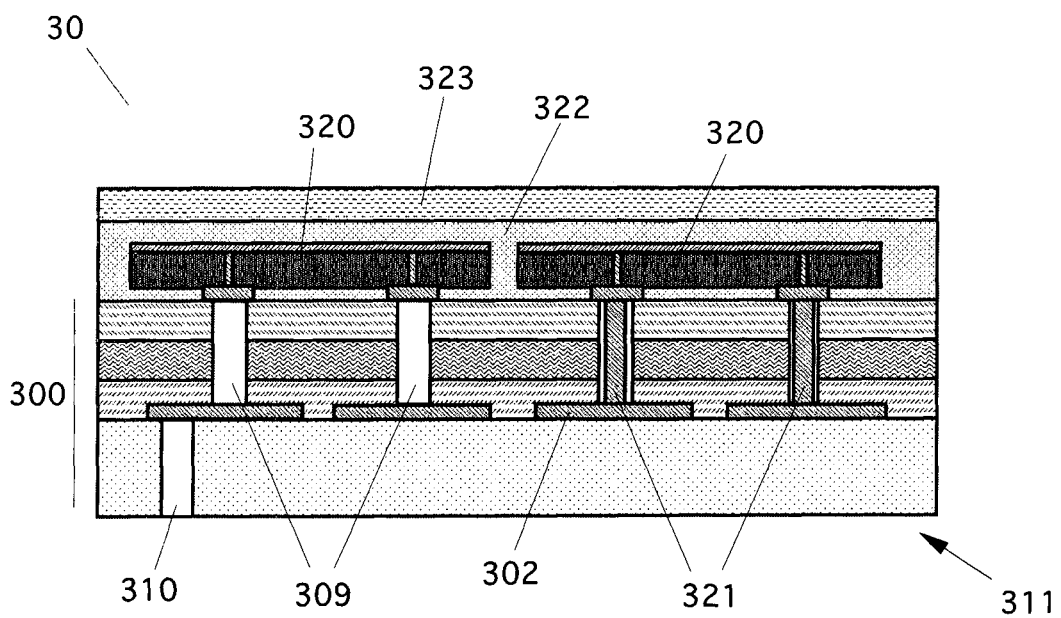
FIG. 2b shows, in a schematic sectional view, the final composition of the photovoltaic panel comprising said backsheet of the BCBS type, as in FIG. 2a, according to the known art as for example in D3.

The present invention describes an innovative automatic production system (10) (FIG. 3) for the assembly and the control of conductive backsheets of the particular type called BCBS (300) with an integrated encapsulating and dielectric layer, see prior art table (FIG. 2a); said conductive backsheets being intended for the construction of photovoltaic panels with a back-contact architecture (30), see prior art table (FIG. 2b). It is observed that said conductive backsheets are of the type described in ITTV2012A000211 (Baccini et al.) and include in their turn a semi-finished element called Stack (308) which is preferably multi-layer, of the type described in ITVI2012A000133 (Baccini et al.). The present invention, moreover, proposes the production process (20a-b) (FIGS. 4a-b) intended to manufacture in an optimized way said conductive backsheet according to said automatic production system (10).

Hence, said BCBS conductive backsheet being a semi-finished product with a complex structure, a compact element which integrates a plurality of superimposed layers with diversified specific functions. Said BCBS conductive backsheet comprising at least: an insulating dielectric back layer (301) which acts as a support, in its turn normally made up of at least two layers the most external of which remains exposed to air and is therefore treated to be more resistant to hydrolysis and to ultraviolet rays, a metal conductive layer (302) suitably shaped and configured with openings (303) according to the back contacts of the cells (320) of the back-contact type to be connected in series, a multi-layer element of the composite type which is conventionally called Stack (308) and is holed (309) in correspondence of the back contacts of said cells (320). Said Stack is made up of one first encapsulating or thermoadhesive layer (305) in contact with said BC and of a second encapsulating or thermoadhesive layer (307) in contact with the cells (320) placed on the upper part, between which an internal layer of dielectric material (306) is interposed which acts as a selective insulating mask, see prior art tables (FIGS. 2a-b). Furthermore, to enable the electrical contacting with the junction box it is provided that on said BC holes (310) are made which are intended for the passage of the conductive elements; to this purpose the conventional solutions in which the contacting is carried out with a manual process are widely known as well as evolved solutions which simplify the assembly of said box also eliminating any handling of the internal elements, which are extremely delicate. Among them one should remember, as a non-exhaustive example, the solutions described in ITTV20130059 (Baccini et al.) and ITTV20130060 (Baccini et al.) providing particular conductive elements of the through type which are fixed to the BC, being interposed between the face facing said box and the face facing the cells where they are integrated in a recessed seat in such a way as to enable the direct contacting in adherence with the conductive layer of the BC.

Furthermore, see prior art tables (FIGS. 2a-b), it is observed that the integrated encapsulating and dielectric layers constituting said Stack (308) have the combined functions of lower encapsulating layer (305 and 307) which fills all the interstitial spaces and is welded to the upper encapsulating layer (322), thus providing a complete sealing and protection to the electrical circuit made with said cells (320) against any harmful atmospheric agent such as moisture, condensation or dust; the dielectric layer (306) interposed to the encapsulating layer, on the other hand, has the function of a selective welding mask, that is to say, it prevents any possible short-circuits that may occur during the heating and polymerization of the conductive adhesives and of the encapsulating layers contained in the photovoltaic module during the rolling phase of construction in the furnace. Said BCBS (300), therefore, is particularly advantageous in terms of production simplification, repeatability and time saving in the assembly of a photovoltaic panel of the back-contact type (30). The assembled structure of a photovoltaic panel with a back-contact architecture (30) comprising said BCBS is therefore simplified with respect to the conventional solutions being made up, in sequence from the back side (311), of: a conductive backsheet with an integrated encapsulating and dielectric layer, called BCBS (300); the photovoltaic cells of the back-contact type (320); a conductive adhesive, for example of the type called ECA (321); a front encapsulating layer (322); a front glass (323). The back layer (301) supporting said BCBS (300) can in its turn be of the composite type, according to the known art, being made up of various normally polymeric and adhesive layers with diversified functions dedicated to the protection from the atmospheric agents, such as moisture and UV rays. As a non-exhaustive example we recall the embodiment of the multi-layer type consisting of a layer of PET against the UV rays, a barrier to vapour, the supporting BS layer and a primer layer of EVA; moreover, we also recall the embodiment of the metal conductive layer protected by a layer of the anti-corrosive type.

The following terms and acronyms, therefore, hereinafter have the following meanings as specified:

BS: is the acronym for the English term backsheet with which one indicates the supporting and closing sheet, of the conventional type, which is placed at the back of the panel;

BC: is the acronym for conductive backsheet, for cells of the back-contact type, being a backsheet which integrates the electrical circuits that realize the electrical connection in series of the solar cells placed thereon;

BCBS: is a particular conductive backsheet with an integrated encapsulating and dielectric layer, in the form of a semi-finished composite and multifunction element which industrially simplifies the assembly of the panels with a back-contact architecture, as described above; Back-contact: one defines as back-contact the photovoltaic cells having the contacts with both positive and negative electrical polarity placed at the back, as a consequence also the panels comprising such cells are defined of the back-contact type;

Stack: a multi-layer semi-finished element, in a coil, made up of two encapsulating layers of the EVA type or polyolefins with an interposed dielectric layer, being holed as provided by the invention.

For the purpose of the present invention, as an alternative one can also use an equivalent solution of the single-layer and multifunction type which combines the adhesive and encapsulating behaviour with the dielectric insulating function, for example by means of a film polymer particularly charged to perform such functions.

The automatic production system (10) provided by the invention (FIG. 3) consists of at least one processing main line (11) which is combined with a secondary line (12), each line (11, 12) being made up of a plurality of operating stations in sequence converging to a common superimposition and connection station (113), to form said BCBS.

Said main line (11) arranges on the lower part a supporting conductive backsheet (304) called BC, as described above, which is carried on trays (130) with continuous conveying (117), if necessary being holed and prepared for the purpose of the following contacting to the back junction box; in particular, one provides a calibrated superimposition on said BC of an encapsulating and dielectric multi-layer element (308) called Stack, as described above, which is also holed for the contacting of the cells. Said Stack is arranged in the secondary line (12) synchronously with said main line (11), and in particular in the preparation station (120) starting from a coil dispenser (121, 308) of said encapsulating material (305, 307) with an interposed dielectric layer (306), being unwound and placed on a level surface (123) and also cut to the required size by means of a cutting tool (122), like a cutter.

The transfer from the preparation station (120) to the drilling station (124) and to the optional synchronization station (125), for the purpose of the following superimposition and fixing on said BC (304, 113), is ensured by an automatic picking device (126) of the type conventionally called pick & place which is particularly intended to pick, move and hold individually said Stack (308) during the processing in said secondary line (12) to release it only after the fixing with pressure and heating on said BC (304), in correspondence of said calibrated superimposition station (113) of the main line (11), in such a way as to arrange and synchronize the two lines (11, 12) according to the detections by said integrated control system (140) and in particular compensating for the alignment and the relative positioning of said holed Stack (308) with respect to said BC (304); this precision of positioning is particularly relevant in correspondence of the electrical contacts of the cells (320), since said Stack also acts as an insulating mask as the interposed layer is dielectric.

To this purpose, said automatic picking device (126) is substantially shaped like a mobile-plate picking hand with vacuum extraction which holds from above said Stick (308) adherent to the picking plane by means of the vacuum in such a way as to not to have offsetting, folds, deformations or withdrawals by the Stack itself during said operations of cutting, drilling, transfer and fixing. On said Stack superimposed to said BC (304), moreover, for the purpose of the fixing which is made simultaneously to the calibrated superimposition (113) when it is still held, the same picking device (126) simultaneously exerts pressure up to 0.5 $Kg/cm^2$ on the surface of the Stack and also heating, direct or indirect, which can be of the selective type for specific zones or total on the whole surface; the temperature change in the time period, which is conventionally called transitory, is rapid and with modulable and programmable growth passing from room temperature up to temperatures between 90° C. and 150° C. in times between 15 seconds and 1 minute. The pressure can be exerted prior to heating or simultaneously, anyway to prevent any deformation of the Stack by the imposed temperature change. Preferably, said device (126) is combined with an integrated control system (140-4) for example by means of an inspection system with detection from below in correspondence of the synchronization station (125) also managed by software of the conventional type for the control of the machine operations, for example of the PLC type, with particular reference to the movements and to the rotations of the picking device (126) for the purpose of orientating and placing with great repeatability; such movements, for example made with maximum tolerances of +/−50 µm with respect to the centre of gravity of said BC (304) each time considered from the starting position and according to the actual position on the transport tray (130).

Said integrated control system (140) enables a wide range of checks and, in particular, position detection and the checks of the working processes carried out storing the data detected and comparing the actual status with a pre-set status; said integrated system (140) is made up of at least four control devices (141-144) which are individually placed in correspondence of the main working processes to be checked (111-113 and 124) and also electronically integrated with one another in such a way as to enable the processing or the simple passage of the product being processed to the following station.

The production system (10) is conceived in such a way that the assembly ends in the unloading station (114) of said BCBS from the tray (130), with at least three branches of which one is for the continuous conveying of said tray (130) and two are for the unloading of the finished product (115, 116), being respectively for products of the compliant and non-compliant type. In case of compliance, that is to say, with a positive result in all the checks previously carried out by the integrated control system (140), said BCBS is unloaded from the main production line (11, 114) by means of an automatic picking tool from the tray (130) and placed in the unloading station of compliant products (115) for following use, being then moved on a roll or belt conveyor, on a pallet or placed in stock, in containers, in piles or even individually packaged; the empty tray (130) returns towards said first station (111) by means of the continuous conveying system (117), for the purpose of starting a new cycle. Vice-versa, in the case of a product which was considered non-compliant by said integrated control system (140), the tray (130) from the unloading station (114) is diverted to the unloading station of the non-compliant products (116) for the following checks and any off-line operations, its place in the continuous conveyor being replaced by an empty tray.

In more detail with reference to the preferred but not exclusive embodiment of the invention, the main line (11) comprises at least the following operating stations (111-6) and the following control devices (141-3) (FIG. 3):

a first station of loading (111) of the single sheet constituting the BC (304) in a tray (130) with the conductive layer (302) facing upwards, as in the operating phase (F1), said BC being taken from a pile (110) of previously made BCs; the tray (130) belongs to a continuous conveying system (117) which is preferably of the horizontal conveyor belt type with ring recirculation or in line on a return plane at a lower height with respect to the working surface. It is observed that said loading operation does not need an accurate and repetitive positioning of the BC (304) in a pre-set position with respect to said tray (130) since the integrated control system (140) allows to store the exact position for all the following working processes;

a first control device (141) which scans the exact position of said BC (304) with respect to said tray (130), as in the check phase (V1a), and checks the presence of the holes (310) for the back contacting of the junction box, as in the check phase (V1b) (20b), if necessary also making in the following station (112) said holes along with the recesses, if provided, in addition to the standard working processes described in following. Said device being for example a linear scanner;

a second station of arrangement of the contacts (112) for the back junction box, where said BC is prepared and conductive elements intended for contacting are integrated; said second optional station (20b), with reference to the operating phases (F2a-b). According to the detections as in (V1) and in particular on the basis of the detected actual position of the BC (304) on the tray (130), one makes the holes (310) if not present and if necessary the recessed seats for the integration of the conductive elements which, as a non-exhaustive example, are of the non-through type as in ITTV2013A000059 (Baccini et al.) or ITTV2013A000060 (Baccini et al.) or of the innovative type, even of the non-through type, for example providing holes or pattern cut openings in said recessed seats to provide maximum freedom in the integration of evolved contacting systems. Such a working process can advantageously be carried out by means of an equipment of the shaped punch type which from above acts on a counter-shaped die forming the recessed seat, said punch also integrating the blade which cuts the opening inside said seat. In the particular system configuration which is related to the manufacturing of a BCBS without such arrangements, said second station (112) is not provided or is not used (20a).

a second control device (142) which checks the actual and correct insertion of the contacts, said second device with reference to the check phase (V2);

a third station of calibrated superimposition with fixing (113) of the Stack (308) on the BC (304), as in the operating phases (F3a-b), with the automatic and synchronized loading from said secondary line (12) where it is holed and pre-oriented on said BC according to its actual position on the tray and where it is also firmly fixed in such a way as to realize said BCBS (300), the loading and fixing being carried out by means of said picking device (126). The fixing occurs advantageously by means of pressure and heating which are exerted by said picking device (126) simultaneously or in sequence, wherein first the pressure occurs and then the heating, continuing to hold it; said pressure, with values up to 0.5 Kg/cm$^2$ on the surface of the Stack. Said heating can be global on the whole area of the Stack or can be selective for single predefined zones if it is preferable to join single portions of the Stack in contact with the BC, and is realizable in a direct way by means of heat sources advantageously integrated in the same device (126) such as for example resistors or heating lamps or induction windings, or it can be realized in an indirect way by means of external sources of the laser type or other light or radiation sources let to pass through suitable openings of said automatic picking device (126). Said heating in particular is carried out in such a way as to activate the adhesion of the lower thermoadhesive in contact with the BC but not its melting or cross-linking since the product is then intended for rolling. In some particular cases it can be advantageous to replace said selective heating with the application of an adhesive in drops or tape, with an equivalent connection;

a third control device (143) for controlling the correct positioning and the connection of the Stack (308) on the BC (304) and also for the final check of the compliance of the product, said third device with reference to the check phases (V3a-b);

a fourth unloading station (114) of the finished product from the tray (130), which is put in recirculation on the continuous conveyor (117), there being at least three branches of which one is for said tray and two are for the finished product (115, 116), said fourth station with reference to the operating phases (F4a-b);

a fifth station (115) of storage of the compliant products;

a sixth station (116) of storage of the non-compliant products for the purpose of the following checks and possible reprocessing.

The secondary line (12) comprises at least the following operating stations (120,124-5), the following control device (144) and the following picking device (126) (FIG. 3):

a seventh station of preparation (120) of said Stack (308) wherein a roller dispenser (121) distributes the multi-layer sheet, previously made in coils, in such a way as to enable unwinding for easy cutting by means of a tool of the cutter type (122) according to pre-set sizes, also variable from piece to piece, and wherein in a horizontal temporary storage (123) it is possible to take one single sheet by means of an automatic picking device (126) which moves it, orientates it and holds it during the following processing phases until the fixing on the BC (304) in said third station (113), being carried out by the same device (126) continuing to hold it, said seventh station with reference to the operating phases (F5a-c);

an eighth station of drilling (124) of said Stack (308), as in the operating phase (F6), carried out from below by means of a programmable laser drilling device, each time defining the number, the size and the arrangement of the holes, also variable from Stack to Stack, according to the layout of the electrical circuit present on the loaded BC and to which said Stack will be fixed in the station 113;

a fourth control device (144) for controlling from below the correct making of said holes, said fourth device with reference to the check phase (V4);

a ninth optional synchronization station (125) wherein, when required, one waits for the loading of the holed Stack on the BC at said third station (113) for the purpose of the calibrated superimposition, the detections by said control devices (141-2, 144) being combined in such a way that the automatic picking device (126) orientates and releases said holed Stack in the correct position for fixing, interrupting the holding action only when the fixing has been carried out to go back to the seventh station (120, 123) and take a new sheet to be processed, said ninth station with reference to the operating phase (F7).

an automatic picking device (126), of the type with a horizontally and vertically mobile plate with a picking surface at least corresponding to said cut Stack (308), being provided with openings with pneumatic vacuum distributed uniformly, some of which are used for the simple holding of the sheet and others are used for the suction and conveyed removal of the fumes and drilling residues and also thermoregulated, in such a way as to perform at least the following functions without interrupting the holding action: taking individually the single Stack (308), roto-translate it along said secondary line (12) holding it adherent and planar during processing, orientate it horizontally, superimpose it to said BC (304) in the calibrated superimposition station (113), simultaneously exert pressure and also heat for the purpose of fixing; and wherein, said heating is carried out in a selective way on particular portions of the contact surface or on the whole surface;

Said heating, in particular, can alternatively be of the direct type, for example made with resistors or lamps integrated in said automatic picking device (126) and with a rapid modulable-growth and programmable temperature transient, said transient being for example between room temperature and 150° C. in a time between 15 seconds and 1 minute; as an alternative, said heating can be of the indirect type, said picking device (126) being provided with through-openings and combined with at least one external radiation source, for example of the laser type as described above.

The production process (20) of said conductive backsheets of the BCBS type (300) comprises the following operating phases (F1-F9) and checks (V1-V4), some of them (F5-7, V4) being particularly related to the secondary process (21) of completion of said Stack (308) and said secondary process (21) being an integral part of said production process (20) (FIGS. 4a-b). In particular there are two variants of said process (20), the first variant (20a) (FIG. 4a) being individually referred to a panel which is not arranged for the contacting of the back junction box, and the second variant (20b) (FIG. 4b) being referred to a panel which instead is arranged for said contacting; set out below are all the phases and the checks provided for the complete cycle, which relates to said second variant (FIG. 4b), therefore not being provided in said first variant (FIG. 4a) the sub-check (V1b), the operating phase (F2) and the check (V2):

operating phase (F1) of loading on the tray (130) of the single sheet of BC (304) with the conductive layer (302) upwards, being carried out in said first station (111) taking it from the pile of sheets (110) upstream of the cycle;

check (V1) for controlling the position and presence of the holes, where in sequence there is the sub-check (V1a) of detection of the position of the BC (304) on the tray (130) and the optional sub-check (V1b) of the presence of the holes (310) for the back junction box, said sub-check (V1b) being of the type with two-way response YES/NO;

operating phase (F2) of arrangement of the contacts for said junction box, optional, where in case of positive response to the check (V1b) the sub-phase (F2b) of insertion of contacting conductive elements is directly carried out, whereas in case of negative response also the sub-phase (F2a) of drilling (310) is previously carried out, if necessary with the simultaneous making of recessed seats in the BC if provided by the shape of the conductive element;

check (V2) for controlling the working processes as in F2, optional;

operating phase (F3) of calibrated superimposition and fixing of the holed Stack (308) on the holed BC (304), where the sub-phase (F3a) of calibrated superimposition is carried out, loading said Stack in a synchronized way directly from the secondary line (12) by means of the automatic picking device (126) which also pre-orientates it according to the actual position with respect to said BC, as detected by the integrated control system (140), and the sub-phase (F3b) of fixing is also carried out, said Stack being firmly connected with pressure and heating by means of the same automatic picking device (126), which releases it when the fixing has been carried out for the purpose of obtaining said finished BCBS; and wherein said heating is intended to activate the adhesion of the lower thermoadhesive in contact with the BC but not its melting or cross-linking since the product is then intended for rolling;

check (V3) of final control, where in sequence there is the sub-check (V3a) of control of the position and connection, as in F3, and also the sub-check (V3b) of compliance of the type with two-way response YES/NO;

operating phase (F4) of unloading of the finished product from the tray (130), said finished product corresponding to a backsheet of the BCBS type (300), where alternatively there are two sub-phases (F4a, F4b) according to the previous compliance check (V3b); in case of a positive response one carries out the sub-phase (F4a) of unloading from the tray (114), which is sent to the continuous conveying system (117); and branching to the station of storage of the compliant products (115) whereas, in case of negative response, the sub-phase (F4b) of unloading (114) and storage of the non-compliant products (116) is carried out;

operating phase (F5) of preparation of the Stack (308) upstream of the secondary line (12), with reference to said secondary process (21), said phase (F5) providing in sequence the sub-phase (F5a) of cutting, the sub-phase (F5b) of optional temporary storage and the sub-phase (F5c) of picking by means of the automatic picking device (126);

operating phase (F6) of drilling of the Stack (308);

check (V4) for controlling the drilling and position of the Stack for the purpose of the calibrated superimposition on the BC, as in F3;

operating phase (F7) of synchronization of the loading of the holed Stack, for the purpose of the calibrated superimposition as in F3, by means of the automatic picking device (126).

For the purpose of lowering industrial costs, also saving the space occupied by the system (10) and the relative investment, it is provided that some of the above-described phases rather than being carried out at different stations, as described above for the sake of simplicity, can advantageously be concentrated and/or integrated in a smaller number of stations although keeping the single functions and the logical sequence of the production process (20a-b) unchanged.

By the automatic system (10) and the production process (20a-b) described above it is possible to obtain industrially, according to the pre-set aims, a conductive backsheet of the BCBS type (300) with an integrated encapsulating and dielectric layer, being ready to be advantageously used as a starting element for the automatic assembly of photovoltaic panels of the back-contact type, for example by means of an automatic system and a production process of the type described in ITTV2012A000211 (Baccini et al.).

REFERENCE

(10) Automatic production system for the assembly and the control of conductive backsheets of the BCBS type comprising an integrated encapsulating and dielectric layer,
(11) main line,
(12) secondary line for the processing of the Stack combined with the main line,
(110) pile of BCs,
(111) first station of BC loading,
(112) second station of arrangement of the contacts,
(113) third station of calibrated superimposition and fixing of the Stack on the BC,
(114) fourth station of unloading from the tray,
(115) fifth station of storage of the compliant products,
(116) sixth station of storage of the non-compliant products,
(117) tray continuous conveyor,
(118) direction of advancement,
(120) seventh station of preparation of the Stack,
(121) roller dispenser,
(122) cutter,
(123) temporary storage for picking,
(124) eighth station of drilling of the Stack,
(125) ninth station of loading synchronization,
(126) automatic picking device,
(130) tray,
(140) integrated control system,
(141) first control device for the detection of the position of the BC,
(142) second device for processing control,
(143) third control device for the control of the position and connection with final check,
(144) fourth device for the detection of the position of the Stack,
(20) production process for the automatic assembly and control of conductive backsheets of the BCBS type comprising an integrated encapsulating and dielectric layer,
(20a) first variant of the process for panels not arranged for back contacting, (20b) second variant of the process for panels arranged for back contacting,
(21) process of preparation of the multi-layer sheets with an encapsulating and dielectric layer of the Stack type,
(30) photovoltaic panel with a back-contact architecture comprising backsheets of the type called BCBS comprising an integrated encapsulating and dielectric layer,
(300) conductive backsheet with an integrated encapsulating and dielectric layer of the BCBS type,
(301) supporting and protection backsheet,
(302) metal conductive layer which electrically connects the photovoltaic cells,
(303) openings which configure the conductive layer according to the specific circuit which will electrically connect the subsequently superimposed cells,
(304) conductive backsheet called BC,
(305) first encapsulating or thermoadhesive layer,
(306) layer of dielectric material interposed in the encapsulating layer,
(307) second encapsulating or thermoadhesive layer,
(308) multi-layer element called Stack,
(309) holes in correspondence of the back contacts of the cells,
(310) opening for the contacting of the back junction box,
(311) back side in shade,
(320) photovoltaic cells of the back-contact type,
(321) cells contacting element,
(322) front encapsulating layer,
(323) glass,
(F1-7) operating phases,
(V1-4) checks.

The invention claimed is:

1. An automatic production system for assembly and control of a conductive backsheet for a photovoltaic panel with a back-contact architecture, the backsheet having an integrated encapsulating and dielectric layer, the system comprising:
at least one processing main line;
at least one processing secondary line;
wherein the main line is combined with the secondary line, each of the main line and the secondary line having operating stations which are configured in sequence with a flow converging to a common station for calibrated superimposition and fixing to form the conductive backsheet with the integrated encapsulating and dielectric layer, the conductive backsheet being formed on a lower part of the main line, the conductive backsheet being carried on trays on a continuous conveying system, the encapsulating and dielectric multi-layer element being formed on an upper part of the secondary line so as to act as an insulating mask once superimposed and fixed on the conductive backsheet in the station;
an integrated control system for controlling positions and processes by comparison of an actual status with a predefined status, said integrated control system being made up of at least four control devices which are individually placed in correspondence to the station to be controlled and automatically integrated with one another so as to enable a processing or a passage of a product being processed to a following station, said secondary line comprising an automatic picking device which is continuous and permanent along the stations so as to take, move and hold individually the encapsulating and dielectric multi-layer element during processing and to release the encapsulated and dielectric multi-layer element only after fixing on the conductive backsheet at the station so as to combine and synchronize the main and secondary lines according to detections by said integrated control system and compensating for alignment and relative positioning of the encapsulating and dielectric multi-layer element with respect to the conductive backsheet; and
an unloading station for unloading the conductive backsheet from the tray, said unloading station having at least three branches of which one branch is for a continuous conveying of the tray and two branches are for a finished product.

2. The system of claim 1, wherein said automatic picking device has a mobile plate with a picking surface corresponding to the encapsulating and dielectric multi-layer element cut in a sheet, said mobile plate having openings with a pneumatic vacuum distributed uniformly, wherein some of the openings hold the sheet and other openings are for suctioning and conveying fumes and drilling residues so as to perform at least the following functions without interrupting the holding of the encapsulating and dielectric multi-layer element, the functions being taking individually the encapsulating and dielectric multi-layer element, translating the encapsulating and dielectric multi-layer element along said secondary line adherent and planar during processing, expelling the drilling residues, orientating encapsulating and dielectric multi-layer element horizontally, superimposing the encapsulating and dielectric multi-layer element onto the conductive backsheet in the station, exerting pressure and heating for fixing.

3. The system of claim 1, wherein said main line comprises:
 a first station for loading a single conductive backsheet into the tray for continuously conveying the conductive backsheet with the conductive layer facing upwardly;
 a first control device which detects an exact position of the conductive backsheet with respect to the tray;
 a second station with an arrangement of contacts which drills so as to form recessed seats and to insert contacting conductive elements for the back junction box;
 a second control device that checks the working processes of said second station;
 a third station of calibrated superimposition and fixing of the encapsulating and dielectric multi-layer element on the conductive backsheet, said third station synchronizing loading from the secondary line by the automatic picking device;
 a third control device that checks working processes carried out at said third station;
 a fourth station for unloading of the finished product from the tray, said fourth station having said at least three branches;
 a fifth station for unloading of compliant products; and
 a sixth station for unloading of non-compliant products.

4. The system of claim 3, wherein said second line comprises:
 a seventh station for preparation of the encapsulating and dielectric multi-layer element wherein a roller dispenser dispenses out the multi-layer sheet so as to enable a horizontal unwinding and cutting to size with a cutting tool;
 an eighth station for drilling the encapsulating and dielectric multi-layer element from below;
 a fourth control device for controlling the drilling by position detection;
 a ninth station for synchronization wherein the detections by said integrated control system are combined such that said automatic picking device orientates and releases the encapsulating and dielectric multi-layer element in a correct position for fixing; and
 an automatic picking device that exerts a pressure of up to 0.5 Kg/cm$^2$ on the surface of the encapsulating and dielectric multilayer element during calibrated coupling with the conductive backsheet, said automatic picking device being combined with said integrated control system and with said electronic controller so as to perform the movements with a maximum tolerances of +1-50 μm with respect to a center-of-gravity of the conductive backsheet.

5. The system of claim 4, wherein said automatic picking device comprises a direct heating system which fixes the encapsulating and dielectric multi-layer element by contact on single surface portions.

6. The system of claim 4, wherein said automatic picking device comprises through-openings and an indirect heating system so as to activate adhesion in said third station.

7. A process for producing conductive backsheets for photovoltaic panels with a back-contact architecture, the conductive backsheets having an integrated encapsulating and dielectric layer, the process having operating phases and control checks, wherein the phases are related to a secondary working process for an encapsulating and dielectric multi-layer element, the process comprising:
 loading on a tray a single sheet of the conductive backsheet with a conductive layer facing upwards, the step of loading being carried out in a first station by taking the single sheet from the pile of sheets upstream of the step of loading;
 checking a position of the conductive backsheet on the tray;
 superimposing and fixing of the encapsulating and dielectric multi-layer element on the conductive backsheet, wherein superimposing is carried out by loading the encapsulating and dielectric multi-layer element in a synchronized manner directly from a secondary line by an automatic picking device which orientates the encapsulating and dielectric multi-layer element according to an actual position with respect to the conductive backsheet as detected by an integrated control system, the step of fixing is also carried out by the encapsulating and dielectric multi-layer element being firmly connected with pressure and heating by the automatic picking device which releases the encapsulating and dielectric multi-layer element only when the fixing has been carried out so as to obtain a finished conductive backsheet with an integrated encapsulating and dielectric layer, and wherein the heating activates an adhesive in contact with the conductive backsheet;
 checking and unloading a finished product from the tray so as to deliver the finished product to a storage of compliant products or to a storage of non-compliant products by way of a continuous conveying system;
 preparing the encapsulating and dielectric multi-layer element upstream of the secondary line by cutting;
 drilling the encapsulating and dielectric multilayer element;
 checking and controlling the drilling and positioning of the encapsulating and dielectric multi-layer element for the purpose of calibrated superimposition on the conductive backsheet; and
 synchronizing the loading of the drilled encapsulating and dielectric multi-layer element for the calibrated superimposition by the automatic picking device.

8. The process of claim 7, further comprising:
 checking and controlling positions of the drilled holes; and
 arranging the contacts for a back junction box by inserting contacting conductive elements.

9. The process of claim 7, wherein the fixing occurs by selective direct heating of by contact with a rapid modulable-growth temperature transient being between room temperature and 150° C. in a time of between 15 seconds and 1 minute.

10. The process of claim 7, wherein the fixing occurs with indirect heating by at least one external radiation source which is combined with said automatic picking device.

\* \* \* \* \*